United States Patent
Komura et al.

(10) Patent No.: US 10,374,151 B2
(45) Date of Patent: Aug. 6, 2019

(54) SPIN CURRENT MAGNETORESISTANCE EFFECT ELEMENT AND MAGNETIC MEMORY

(71) Applicant: TDK CORPORATION, Tokyo (JP)

(72) Inventors: Eiji Komura, Tokyo (JP); Yohei Shiokawa, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/055,589

(22) Filed: Aug. 6, 2018

(65) Prior Publication Data

US 2019/0067563 A1 Feb. 28, 2019

(30) Foreign Application Priority Data

Aug. 22, 2017 (JP) .................. 2017-159402
Jun. 25, 2018 (JP) .................. 2018-119920

(51) Int. Cl.
*H01L 29/82* (2006.01)
*H01L 43/08* (2006.01)
(Continued)

(52) U.S. Cl.
CPC ............ *H01L 43/08* (2013.01); *G01R 33/093* (2013.01); *G01R 33/098* (2013.01);
(Continued)

(58) Field of Classification Search
CPC ....................................... H01L 43/08
(Continued)

(56) References Cited

U.S. PATENT DOCUMENTS 8,350,347 B2 1/2013 Gaudin et al.
2014/0056060 A1* 2/2014 Khvalkovskiy ....... H01L 27/228
365/158

(Continued)

FOREIGN PATENT DOCUMENTS

CN 107887505 A * 4/2018 ............. H01L 43/10
WO 2016/021468 A1 2/2016

OTHER PUBLICATIONS

Miron, Ioan Mihai, et al., "Perpendicular switching of a single ferromagnetic layer induced by in-plane current injection.", Nature, vol. 476, pp. 189-194, (2011).
(Continued)

*Primary Examiner* — Ajay Arora
(74) *Attorney, Agent, or Firm* — Oliff PLC

(57) ABSTRACT

Provided is a spin current magnetoresistance effect element, including: a magnetoresistance effect element including a first ferromagnetic metal layer, a second ferromagnetic metal layer configured for magnetization direction to be changed, and a non-magnetic layer sandwiched between the first ferromagnetic metal layer and the second ferromagnetic metal layer; and a spin-orbit torque wiring extending in a first direction which intersects a lamination direction of the magnetoresistance effect element and joined to the second ferromagnetic metal layer, wherein, a third end portion of the non-magnetic layer is located between a first end portion of the first ferromagnetic metal layer and a second end portion of the second ferromagnetic metal layer as viewed from the lamination direction on one of side surfaces of the magnetoresistance effect element.

20 Claims, 6 Drawing Sheets

(51) Int. Cl.
- *H01L 43/04* (2006.01)
- *G11C 11/16* (2006.01)
- *G01R 33/09* (2006.01)
- *H01L 43/06* (2006.01)

(52) U.S. Cl.
CPC ............ *G11C 11/161* (2013.01); *H01L 43/04* (2013.01); *H01L 43/06* (2013.01)

(58) Field of Classification Search
USPC ......................................................... 257/421
See application file for complete search history.

(56) References Cited

U.S. PATENT DOCUMENTS

| | | | |
|---|---|---|---|
| 2015/0348606 A1 | 12/2015 | Buhrman et al. | |
| 2017/0177514 A1* | 6/2017 | Lee | G06F 13/1668 |
| 2017/0222135 A1 | 8/2017 | Fukami et al. | |
| 2019/0074041 A1* | 3/2019 | Jung | G11C 11/161 |

OTHER PUBLICATIONS

Kato, Y.K., et al., "Observation of the Spin Hall Effect in Semiconductors.", Science, vol. 306, No. 1910, pp. 1910-1913, (2004).

Liu, Luqiao, et al., "Spin torque switching with the giant spin Hall effect of tantalum.", Science, vol. 336, No. 555, (2012).

Liu, Luqiao, et al., "Current-Induced Switching of Perpendicularly Magnetized Magnetic Layers Using Spin Torque from the Spin Hall effect.", Physical Review Letters, vol. 109, pp. 096602-1 to 096602-5, (2012).

Lee, Ki-Seung et al., "Threshold current for switching of a perpendicular magnetic layer induced by spin Hall effect.", Applied Physics Letters, vol. 102, pp. 112410-1 to 112410-5, (2013).

Lee, Ki-Seung et al., "Thermally activated switching of perpendicular magnet by spin-orbit spin torque.", Applied Physics Letters, vol. 104, pp. 072413-1 to 072413-5, (2014).

Fukami, Shunsuke et al., "Magnetization switching by spin-orbit torque in an antiferromagnet-ferromagnet bilayer system.", Nature Materials, vol. 15, pp. 535-542, (2016).

Fukami, S. et al., "A spin-orbit torque switching scheme with collinear magnetic easy axis and current configuration.", Nature Nanotechnology, vol. 11, No. 621, pp. 1-6, (2016).

Takahashi, S. et al., "Spin injection and detection in magnetic nanostructures.", Physical Review B, vol. 67, pp. 052409-1 to 052409-4, (2003).

Seo, Yeongkyo et al., "Area-Efficient SOT-MRAM With a Schottky Diode.", IEEE Electron Device Letters, vol. 37, No. 8, pp. 982-985, (2016).

Zhang, Wei et al., "Spin Hall Effects in Metallic Antiferromagnets.", Physical Review Letters, vol. 113, pp. 196602-1 to 196602-6, (2014).

Sato, H. et al., "Perpendicular-anisotropy CoFeB—MgO magnetic tunnel junctions with a MgO/CoFeB/Ta/CoFeB/MgO recording structure.", Applied Physics Letters, vol. 101, pp. 022414-1 to 022414-4, (2012).

* cited by examiner

SPIN CURRENT MAGNETORESISTANCE EFFECT ELEMENT AND MAGNETIC MEMORY

BACKGROUND

The present invention relates to a spin current magnetoresistance effect element and a magnetic memory.

Priority is claimed on Japanese Patent Application No. 2017-159402, filed on Aug. 22, 2017 and Japanese Patent Application No. 2018-119920, filed on Jun. 25, 2018, the contents of which are incorporated herein by reference.

Description of Related Art

Giant magnetoresistance (GMR) elements formed of multilayer films, i.e., ferromagnetic layers and non-magnetic layers, and tunneling magnetoresistance (TMR) elements using insulating layers (tunnel barrier layers or barrier layers) as non-magnetic layers are known as magnetoresistance effect elements. Generally, TMR elements have element resistances and magnetoresistance (MR) ratios higher than those of GMR elements. For this reason, TMR elements have attracted attention as elements for magnetic sensors, high frequency components, magnetic heads, and nonvolatile random access memories (MRAMs).

In an MRAM, data is read and written using characteristics in which an element resistance of a TMR element changes when magnetization directions of two ferromagnetic layers sandwiching an insulating layer change. As writing methods for MRAMs, a method in which writing (magnetization reversal) is performed using a magnetic field produced by a current and a method in which writing (magnetization reversal) is performed using a spin transfer torque (STT) occurring when a current flows in a lamination direction of a magnetoresistance effect element are known.

Magnetization reversals of TMR elements using an STT are efficient in view of energy efficiency, but a reversal current density causing magnetization reversal to be performed is high. In terms of a long life of TMR elements, it is desirable that reversal current densities be low. This applies to GMR elements.

Therefore, in recent years, magnetization reversal in which magnetization is reversed by a mechanism different from an STT as a means for reducing a rotational current and a pure spin current generated due to a spin orbit interaction is used has been attracting attention (for example, I. M. Miron, K. Garello, G Gaudin, P. J. Zermatten, M. V. Costache, S. Auffret, S. Bandiera, B. Rodmacq, A. Schuhl, and P. Gambardella, Nature, 476, 189 (2011)). The mechanism therefor has not yet become sufficiently clear. However, it is conceivable that a pure spin current generated due to a spin orbit interaction or a Rashba effect at an interface between different materials induces a spin-orbit torque (SOT) and magnetization reversal occurs due to the SOT. A pure spin current is generated when the same number of electrons with an upward spin and electrons with a downward spin flow in opposite directions and flows of charge cancel each other out. For this reason, a current flowing through a magnetoresistance effect element is zero and realization of a magnetoresistance effect element with a long lifespan would be expected.

On the other hand, it is said that, in a magnetization reversal using an SOT, it is necessary to disturb the symmetry of the magnetization subjected to the magnetization reversal by applying an external magnetic field. In order to apply an external magnetic field, a generation source for a magnetic field is required. The provision of the generation source for the magnetic field separately leads to a decrease in degree of integration of an integrated circuit including a spin-current magnetization rotational element. For this reason, there is a demand for a method in which a magnetization reversal can be performed using an SOT without applying an external magnetic field. For example, PCT International Publication No. WO2016/021468 describes an element in which an axis of easy magnetization of a recording layer is non-uniform in the recording layer and a plurality of regions having different axes of easy magnetization are provided in the recording layer.

SUMMARY

However, in the magnetoresistance effect element described in PCT International Publication No. WO2016/021468, the influence of the magnetization of a magnetization fixed layer is strong and the direction of the axis of easy magnetization of a recording layer cannot be set to be sufficiently non-uniform in the recording layer. For this reason, it is not possible to sufficiently increase the writing efficiency through a magnetization reversal using a spin-orbit torque (SOT) effect.

The present invention was made in view of the above-described problems and an object of the present disclosure is to provide a spin current magnetoresistance effect element having excellent writing efficiency through a magnetization reversal using a spin-orbit torque (SOT) effect.

The inventors of the present invention defined an end portion position of each layer in a magnetoresistance effect element and set a more non-uniform direction of an axis of easy magnetization in a second ferromagnetic metal layer. Moreover, it was found that, when a part of a current when data is written is divided in the second ferromagnetic metal layer and a spin transfer torque is applied to the magnetization of the second ferromagnetic metal layer or the movement of a magnetic wall is used, the magnetization of the second ferromagnetic metal layer can be easily reversed. Furthermore, it was found that, when regions having different axes of easy magnetization (including a magnetization alleviation region configured to alleviate the non-uniformity of the magnetization) are provided in a portion in which the regions and a first ferromagnetic metal do not overlap and the influence on an MR ratio is small, it is possible to minimize a decrease in MR ratio of the magnetoresistance effect element.

That is to say, the present disclosure is directed to the following means to solve the above-described problems.

(1) A spin current magnetoresistance effect element, including:

a magnetoresistance effect element including a first ferromagnetic metal layer, a second ferromagnetic metal layer configured for magnetization direction to be changed, and a non-magnetic layer sandwiched between the first ferromagnetic metal layer and the second ferromagnetic metal layer; and a spin-orbit torque wiring extending in a first direction which intersects a lamination direction of the magnetoresistance effect element and joined to the second ferromagnetic metal layer, wherein, a third end portion of the non-magnetic layer is located between a first end portion of the first ferromagnetic metal layer and a second end portion of the second ferromagnetic metal layer as viewed from the lamination direction on one of side surfaces of the magnetoresistance effect element.

(2) In the spin current magnetoresistance effect element according to the above aspect, a distance between the second end portion and the third end portion may longer than a distance between the first end portion and the third end portion.

(3) In the spin current magnetoresistance effect element according to the above aspect, the one of side surfaces on which the first end portion, the second end portion, and the third end portion are present may be located in the first direction of the magnetoresistance effect element.

(4) In the spin current magnetoresistance effect element according to the above aspect, a distance between the second end portion and the third end portion may be longer than a thickness of the spin-orbit torque wiring.

(5) In the spin current magnetoresistance effect element according to the above aspect, a distance between the first end portion and the third end portion may be shorter than a thickness of the spin-orbit torque wiring.

(6) In the spin current magnetoresistance effect element according to the above aspect, a distance between the second end portion and the third end portion may be shorter than a width of the second ferromagnetic metal layer in a direction perpendicular to the first direction and the lamination direction.

(7) In the spin current magnetoresistance effect element according to the above aspect, a distance between the first end portion and the third end portion may be shorter than a width of the second ferromagnetic metal layer in the direction perpendicular to the first direction and the lamination direction.

(8) In the spin current magnetoresistance effect element according to the above aspect, a distance between the second end portion and the third end portion may be longer than a width of the second ferromagnetic metal layer in a direction perpendicular to the first direction and the lamination direction.

(9) In the spin current magnetoresistance effect element according to the above aspect, a distance between the first end portion and the third end portion may be longer than the width of the second ferromagnetic metal layer in the direction perpendicular to the first direction and the lamination direction.

(10) In the spin current magnetoresistance effect element according to the above aspect, the one of side surfaces of the magnetoresistance effect element may be an inclined surface extending from the first ferromagnetic metal layer toward the second ferromagnetic metal layer in the lamination direction.

(11) A magnetic memory according to a second aspect includes: the plurality of spin current magnetoresistance effect elements according to the above aspect.

According to the spin current magnetoresistance effect element and the magnetic memory associated with the above aspects, a spin current magnetoresistance effect element having excellent writing efficiency through a magnetization reversal using a spin-orbit torque (SOT) effect can be obtained.

DETAILED DESCRIPTION

Embodiments will be described in detail below with reference to the drawings as appropriate. The drawings used in the following description sometimes show enlarged characteristic portions for the sake of convenience and in order to make the features easier to understand, and the dimensional proportions or the like of each component may be different from actual ones. Materials, dimensions, and the like exemplified in the following description are merely examples, the present disclosure is not limited thereto, and the present disclosure can be realized by appropriately modifying these within a range in which the effects of the present disclosure are achieved.

(Spin Current Magnetoresistance Effect Element)

Figure 1:
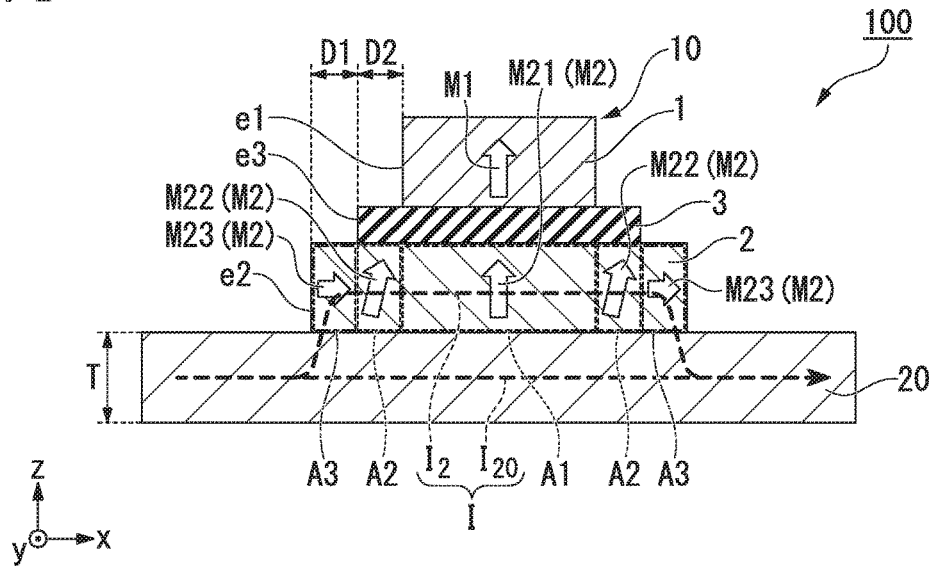
FIG. 1 is a cross-sectional view schematically showing a spin current magnetoresistance effect element according to an embodiment.

FIG. 1 is a cross-sectional view schematically showing a spin current magnetoresistance effect element according to a first embodiment. A spin current magnetoresistance effect element 100 according to the first embodiment includes a magnetoresistance effect element 10 and a spin-orbit torque wiring 20.

Here, in the following description, a lamination direction of the magnetoresistance effect element 10 is defined as a z direction and a first direction in which the spin-orbit torque wiring 20 extends is defined as an x direction. Furthermore, a second direction orthogonal to both of the z direction and the x direction is defined as a y direction.

<Magnetoresistance Effect Element>

The magnetoresistance effect element 10 includes a first ferromagnetic metal layer 1, a second ferromagnetic metal layer 2 whose magnetization direction changes, and a non-magnetic layer 3 sandwiched between the first ferromagnetic metal layer 1 and the second ferromagnetic metal layer 2. A magnetization M1 of the first ferromagnetic metal layer 1 is fixed relative to a magnetization M2 of the second ferromagnetic metal layer 2.

The magnetoresistance effect element 10 operates when orientations of the magnetization M1 of the first ferromagnetic metal layer 1 and the magnetization M2 of the second ferromagnetic metal layer 2 relatively change. When a coercivity-differing type (pseudo spin valve type) magnetic random access memory (MRAM) is applied to the magnetoresistance effect element 10, the coercivity of the first ferromagnetic metal layer 1 of the magnetoresistance effect element 10 is larger than the coercivity of the second ferromagnetic metal layer 2 thereof. When an exchange bias type (spin valve type) MRAM is applied to the magnetoresistance effect element 10, the magnetization M1 of the first ferromagnetic metal layer 1 in the magnetoresistance effect element 10 is fixed using an exchange coupling with an antiferromagnetic layer.

The magnetoresistance effect element 10 is a tunneling magnetoresistance (TMR) element when the non-magnetic layer 3 is made of an insulator and is a giant magnetoresistance (GMR) element when the non-magnetic layer 3 is made of a metal.

A lamination constitution of the magnetoresistance effect element 10 can adopt a lamination constitution of a well-known magnetoresistance effect element. For example, each layer may be constituted of a plurality of layers and may include other layers such as an antiferromagnetic layer configured to fix a magnetization direction of the first ferromagnetic metal layer 1. The first ferromagnetic metal layer 1 is referred to as a fixed layer or a reference layer and the second ferromagnetic metal layer 2 is referred to as a free layer, a memory layer, or the like.

In the magnetoresistance effect element 10 illustrated in FIG. 1, a third end portion e3 of the non-magnetic layer 3 in the x direction is located between a first end portion e1 of the first ferromagnetic metal layer 1 in the x direction and a second end portion e2 of the second ferromagnetic metal layer 2 in the x direction.

Figure 2A:
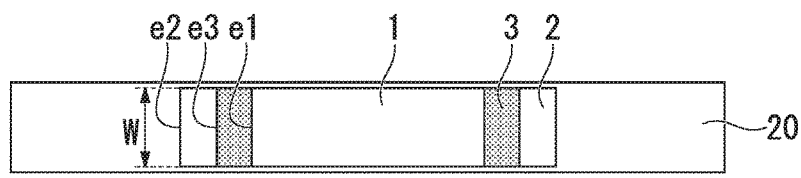
FIG. 2A is a diagram of the spin current magnetoresistance effect element according to the embodiment viewed in a plan view from a z direction.
Figure 2B:
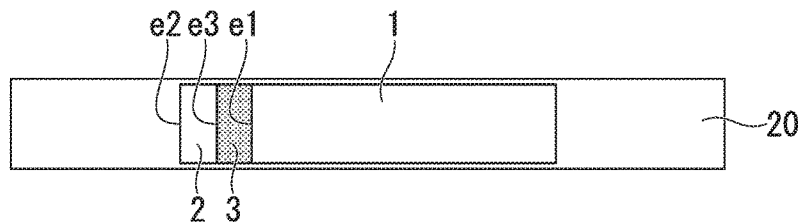
FIG. 2B is a diagram of the spin current magnetoresistance effect element according to the embodiment viewed in a plan view from a z direction.
Figure 2C:
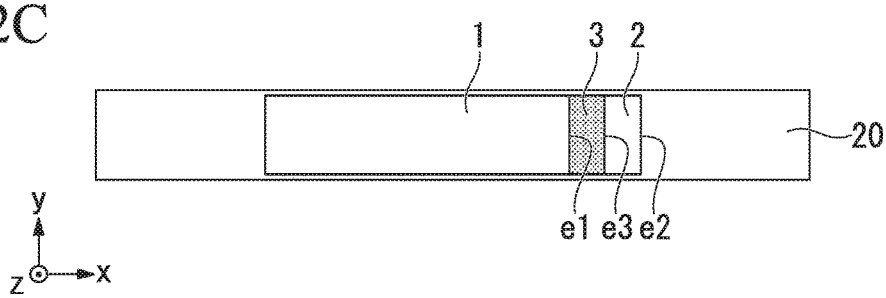
FIG. 2C is a diagram of the spin current magnetoresistance effect element according to the embodiment viewed in a plan view from a z direction.

In FIG. 1, the first end portion e1, the second end portion e2, and the third end portion e3 satisfy this relationship on both side surfaces of the magnetoresistance effect element 10 in the x direction. This relationship need only be satisfied on one lateral side of the magnetoresistance effect element 10 in the x direction, but it is particularly desirable that the relationship be satisfied on a front lateral side in a flow direction of a write current. FIGS. 2A to 2C are diagrams of the spin current magnetoresistance effect element according to the first embodiment viewed in a plan view from the z direction. FIG. 2A is the diagram of the spin current magnetoresistance effect element 100 in FIG. 1 viewed from the z direction. FIGS. 2B and 2C are the diagrams of a spin current magnetoresistance effect element according to another example viewed from the z direction.

When the end portions (the first end portion e1, the second end portion e2, and the third end portion e3) of the layers (the first ferromagnetic metal layer 1, the second ferromagnetic metal layer 2, and the non-magnetic layer 3) constituting the magnetoresistance effect element 10 satisfy this relationship, three regions with different magnetic anisotropies are formed in the second ferromagnetic metal layer 2.

A first region A1 in the second ferromagnetic metal layer 2 is a region opposite to the first ferromagnetic metal layer 1. The magnetization M21 of the first region A1 has strong magnetic anisotropy in the z direction under the influence of the magnetization M1 of the first ferromagnetic metal layer 1.

A second region A2 in the second ferromagnetic metal layer 2 is a region which is sandwiched between the non-magnetic layer 3 and the spin-orbit torque wiring 20 and does not overlap the first ferromagnetic metal layer 1 as viewed from the z direction. When the magnetization M22 of the second region A2 is sandwiched between the non-magnetic layer 3 and the spin-orbit torque wiring 20, the magnetization M22 of the second region A2 has magnetic anisotropy in the z direction under the influence of interfaces with the non-magnetic layer 3 and the spin-orbit torque wiring 20. Here, the strength of the magnetic anisotropy of the second region A2 is weaker than that of the first region A1 by an amount corresponding to the magnetization M1 of the first ferromagnetic metal layer 1 in which the first ferromagnetic metal layer 1 does not face the second region A2.

A third region A3 in the second ferromagnetic metal layer 2 is a region which does not overlap the first ferromagnetic metal layer 1 and the non-magnetic layer 3 as viewed from the z direction. The magnetizations M21 and M22 of the first region A1 and the second region A2 in the second ferromagnetic metal layer 2 are oriented in the z direction when the spin current magnetoresistance effect element 100 is annealed and the second ferromagnetic metal layer 2 is affected by the crystal structure of the non-magnetic layer 3. On the other hand, the magnetization M23 of the third region A3 is not a magnetization of a layer laminated in the z direction. As a result, perpendicular magnetic anisotropy is not applied to the third region A3. In other words, the magnetization M23 is not oriented in the z direction and is extremely in-plane oriented in xy directions.

In this way, the second ferromagnetic metal layer 2 has three regions having different axes of easy magnetization. Perpendicular magnetic anisotropies of the three regions are stronger in order of the first region A1, the second region A2, and the third region A3. Furthermore, in in-plane magnetic anisotropies of the three regions, the in-plane magnetic anisotropies are stronger in order of the third region A3, the second region A2, and the first region A1. When a region having different magnetic anisotropy is present in the second ferromagnetic metal layer 2, a magnetization reversal of the magnetization M2 in the second ferromagnetic metal layer 2 becomes easy. This reason for this will be described later.

As materials for the first ferromagnetic metal layer 1, well-known materials can be used. For example, a metal selected from the group consisting of Cr, Mn, Co, Fe, and Ni and an alloy including at least one of these metals and exhibiting ferromagnetism can be used. Furthermore, an alloy containing at least one of these metals and at least one element from B, C, and N can also be used. To be specific, Co—Fe, Co—Fe—B, and the like may be exemplified.

Also, in order to obtain a higher output, it is desirable to use a Heusler alloy such as $Co_2FeSi$. Heusler alloy contains an intermetallic compound having a chemical composition represented by $X_2YZ$, where X is a transition metal element or a noble metal element from the Co, Fe, Ni, or Cu groups in the periodic table, Y is a transition metal from the Mn, V, Cr, or Ti groups or an element of the X type, and Z is a typical element from Group III to Group V. For example, $Co_2FeSi$, $Co_2MnSi$, $Co_2Mn_{1-a}Fe_aAl_bSi_{1-b}$, and the like may be exemplified.

In order to further increase the coercivity of the first ferromagnetic metal layer 1 with respect to the second ferromagnetic metal layer 2, an antiferromagnetic material such as IrMn and PtMn may be laminated on a surface of the first ferromagnetic metal layer 1 opposite to the second ferromagnetic metal layer 2. In order to prevent a leakage magnetic field of the first ferromagnetic metal layer 1 from affecting the second ferromagnetic metal layer 2, a synthetic ferromagnetic coupling structure may be adopted.

In addition, when the orientation of magnetization of the first ferromagnetic metal layer 1 is perpendicular to a lamination surface, it is desirable to use a laminated film of Co and Pt. To be specific, the first ferromagnetic metal layer 1 can be formed in order of FeB(1.0 nm)/Ta(0.2 nm)/[Pt (0.16 nm)/Co(0.16 nm)]$_4$/Ru(0.9 nm)/[Co(0.24 nm)/Pt(0.16 nm)]$_6$ from the non-magnetic layer 3 side.

As materials for the second ferromagnetic metal layer 2, ferromagnetic materials, particularly soft magnetic materials can be applied. For example, a metal selected from the group consisting of Cr, Mn, Co, Fe, and Ni, an alloy containing one or more of these metals, an alloy containing at least one of these metals and at least one element from B, C, and N, and the like can be used. To be specific, Co—Fe, Co—Fe—B, and Ni—Fe may be exemplified. For example, CoFeB exhibits in-plane magnetic anisotropy in the case of a single substance and exhibits perpendicular magnetic anisotropy when CoFeB is sandwiched between the non-magnetic layer 3 and the spin-orbit torque wiring 20.

Well-known materials can be used for the non-magnetic layer 3.

For example, when the non-magnetic layer 3 is made of an insulator (in the case of a tunnel barrier layer), as materials thereof, $Al_2O_3$, $SiO_2$, MgO, $MgAl_2O_4$, and the like can be used. In addition to these materials, materials and the like obtained by substituting a part of Al, Si, and Mg in these materials with Zn, Be, or the like can also be used. Since MgO and $MgAl_2O_4$ among them are materials capable of realizing coherent tunneling, MgO and $MgAl_2O_4$ are desirable in that they can inject spins efficiently.

When the non-magnetic layer 3 is made of a metal, Cu, Au, Ag, and the like can be used as the material.

The magnetoresistance effect element 10 may have other layers. For example, an underlayer may be provided on a surface of the second ferromagnetic metal layer 2 opposite to the non-magnetic layer 3 and a cap layer may be provided on a surface of the first ferromagnetic metal layer 1 opposite to the non-magnetic layer 3.

It is desirable that a layer arranged between the spin-orbit torque wiring 20 and the magnetoresistance effect element 10 do not dissipate spins propagating from the spin-orbit torque wiring 20. For example, it is known that silver, copper, magnesium, aluminum, and the like have long spin diffusion lengths of 100 nm or more and it is difficult for them to dissipate spins.

A thickness of this layer is preferably spin diffusion lengths or less of materials constituting the layer. When a thickness of the layer is spin diffusion lengths or less, spins propagating from the spin-orbit torque wiring 20 can be sufficiently transferred to the magnetoresistance effect element 10.

<Spin-Orbit Torque Wiring>

The spin-orbit torque wiring 20 extends in the x direction. The spin-orbit torque wiring 20 is connected to one surface of the second ferromagnetic metal layer 2 in the z direction. The spin-orbit torque wiring 20 may be directly connected to the second ferromagnetic metal layer 2 and may be connected to the second ferromagnetic metal layer 2 via another layer.

The spin-orbit torque wiring 20 is made of a material which generates a pure spin current due to a spin Hall effect when a current flows therethrough. Any material may be adopted as such a material as long as the material is configured to generate a pure spin current in the spin-orbit torque wiring 20. Therefore, the material is not limited to a material consisting of a single element and may be a material and the like composed of a portion constituted of a material which generates a pure spin current and a portion constituted of a material which does not generate a pure spin current.

A spin Hall effect is a phenomenon in which a pure spin current is induced in a direction perpendicular to a direction of a current on the basis of spin-orbit interaction when the current flows through a material.

Figure 3:
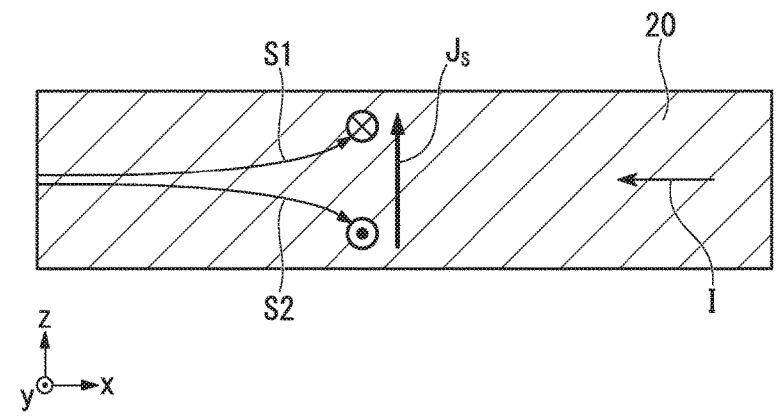
FIG. 3 is a schematic diagram for explaining a spin Hall effect.

FIG. 3 is a schematic diagram for explaining a spin Hall effect. FIG. 3 is a cross-sectional view of the spin-orbit torque wiring 20 illustrated in FIG. 1 taken in the x direction. A mechanism due to which a pure spin current is generated due to a spin Hall effect will be described with reference to FIG. 3.

As illustrated in FIG. 3, when a current I flows in an extension direction of the spin-orbit torque wiring 20, first spins S1 oriented behind the paper and second spins S2 oriented forward of the paper are each bent in a direction perpendicular to a direction of the current I. A normal Hall effect and a spin Hall effect are the same in that a movement (traveling) direction of moving (traveling) charges (electrons) is bent. However, a normal Hall effect and a spin Hall effect significantly differ in that, in a normal Hall effect, charged particles moving in a magnetic field are subjected to a Lorentz force and thus a movement direction of the charged particles is bent, whereas in a spin Hall effect, as long as electrons travel (a current flows) even when no magnetic field is present, a traveling direction thereof is bent.

The number of electrons in the first spins S1 and the number of electrons in the second spins S2 are the same in a non-magnetic material (a material which is not a ferromagnetic material). Thus, the number of electrons in the first spins S1 facing upward and the number of electrons in the second spins S2 facing downward are the same in FIG. 3. For this reason, a current that is a net flow of charges is zero. A spin current without involving this current is particularly referred to as a pure spin current.

When a current flows through a ferromagnetic material, the first spins S1 and the second spins S2 are the same in that the first spins S1 and the second spins S2 are bent in opposite directions to each other. On the other hand, the first spins S1 and the second spins S2 differ in that many first spins S1 and second spins S2 are present in a ferromagnetic material, and as a result, a net flow of a charge occurs (a voltage is generated). Therefore, a material for the spin-orbit torque wiring 20 does not include a material constituted only of a ferromagnetic material.

Here, if an electron flow of the first spins S1 is represented by $J_\uparrow$, an electron flow of the second spins S2 is represented by $J_\downarrow$, and a spin current is represented by $J_S$, $J_S=J_\uparrow-J_\downarrow$ is defined. In FIG. 3, $J_S$ flows as a pure spin current upward in the drawing. Here, $J_S$ is an electron flow with a polarizability of 100%.

In FIG. 1, when a ferromagnetic material is brought into contact with an upper surface of the spin-orbit torque wiring 20, a pure spin current diffuses and flows into the ferromagnetic material. In other words, spin is injected into the magnetoresistance effect element 10.

The spin-orbit torque wiring 20 may include a non-magnetic heavy metal. Here, the term "heavy metal" refers to a metal having a specific gravity equal to or higher than that of yttrium. The spin-orbit torque wiring 20 may be made only of a non-magnetic heavy metal.

In this case, a non-magnetic heavy metal is preferably a non-magnetic metal which has a high atomic number equal to or higher than an atomic number of 39 and has d electrons or f electrons in the outermost shell. This is because such a non-magnetic metal has a strong spin-orbit interaction which causes a spin Hall effect. The spin-orbit torque wiring 20 may be made only of a non-magnetic metal which has a high atomic number equal to or higher than an atomic number of 39 and has d electrons or f electrons in the outermost shell.

Generally, when a current flows through a metal, all electrons move in an opposite direction from that of the current regardless of their spin orientation. On the other hand, in a non-magnetic metal which has d electrons or f electrons in the outermost shell and has a high atomic number, a direction in which electrons move depends on spin orientation of the electrons due to a spin Hall effect. A non-magnetic metal having a high atomic number has a large spin-orbit interaction and thus a pure spin current $J_s$ is easily generated.

Also, the spin-orbit torque wiring 20 may include a magnetic metal. A magnetic metal refers to a ferromagnetic metal or an antiferromagnetic metal. This is because, when a small amount of a magnetic metal is contained in a non-magnetic metal, a spin-orbit interaction is increased and it is possible to increase spin current generation efficiency with respect to a current flowing through the spin-orbit torque wiring 20. The spin-orbit torque wiring 20 may be made only of an antiferromagnetic metal.

A spin-orbit interaction is caused by an intrinsic in-field of a substance of a spin-orbit torque wiring material. For this reason, a pure spin current is generated even in a non-magnetic material. When a small amount of a magnetic metal is added to a spin-orbit torque wiring material, a magnetic metal itself scatters spins of flowing electrons. Thus, spin current generation efficiency is improved. Here, when an amount of a magnetic metal to be added is excessively increased, a generated pure spin current is scattered due to the added magnetic metal, and as a result, an action of reducing a spin current increases. Therefore, it is desirable that a molar ratio of a magnetic metal to be added be sufficiently smaller than a molar ratio of a main ingredient of a pure spin generating portion in a spin-orbit torque wiring. For reference, a molar ratio of a magnetic metal to be added is preferably 3% or less.

Also, the spin-orbit torque wiring 20 may include a topological insulator. The spin-orbit torque wiring 20 may be made only of a topological insulator. A topological insulator is a substance in which an inside of the substance is made of an insulator or a high resistance substance and a spin-polarized metal state occurs in a surface thereof. This substance has an internal magnetic field called a spin-orbit interaction. Thus, a new topological phase appears due to an effect of a spin-orbit interaction even when no external magnetic field is present. This is a topological insulator and it is possible to generate a pure spin current with high efficiency due to a strong spin-orbit interaction and breakdown of rotational symmetry at an edge.

As topological insulators, for example, SnTe, $Bi_{1.5}Sb_{0.5}Te_{1.7}Se_{1.3}$, $TlBiSe_2$, $Bi_2Te_3$, $(Bi_{1-x}Sb_x)_2Te_3$, and the like are desirable. These topological insulators can generate a spin current with high efficiency.

The spin current magnetoresistance effect element 100 may include constituent elements other than the magnetoresistance effect element 10 and the spin-orbit torque wiring 20. For example, a substrate or the like may be provided as a support body. A substrate preferably has excellent flatness and examples of a material of the substrate include Si, AlTiC, and the like.

(Operation of Spin Current Magnetoresistance Effect Element)

A writing operation of the spin current magnetoresistance effect element 100 will be described with reference to FIG. 1. When data is written to the spin current magnetoresistance effect element 100, a current I flows through the spin-orbit torque wiring 20. The current I flowing through the spin-orbit torque wiring 20 is divided into a first current $I_{20}$ and a second current $I_2$ in a portion of the spin-orbit torque wiring 20 overlapping the magnetoresistance effect element 10 as viewed from the z direction.

The first current $I_{20}$ flows in the spin-orbit torque wiring 20. The first current $I_{20}$ generates a pure spin current as described above and causes spins oriented in one direction to be injected into the second ferromagnetic metal layer 2. The injected spins provide a spin-orbit torque (SOT) to the magnetization M21 of the first region A1.

On the other hand, the second current $I_2$ flows in the second ferromagnetic metal layer 2. The second current $I_2$ flows in directions in which the second current $I_2$ passes through regions having different magnetization directions in order of the third region A3, the second region A2, and the first region A1 having different axes of easy magnetization. That is to say, the same current flow as in a write current of a spin transfer torque (STT) type magnetoresistance effect element is formed. In other words, the second current $I_2$ is spin-polarized when passing through the third region A3. The spin-polarized second current $I_2$ provides an STT to the magnetization M22 of the second region A2 and the magnetization M21 of the first region A1.

Here, the perpendicular magnetic anisotropy of the magnetization M22 of the second region A2 is weaker than the perpendicular magnetic anisotropy of the magnetization M21 of the first region A1. In other words, the magnetization M22 of the second region A2 is more easily subjected to a magnetization reversal than the magnetization M21 of the first region A1. For this reason, first, when the magnetization M22 of the second region A2 is reversed using an STT and SOT and its influence is transferred to the magnetization M21 of the first region A1, the magnetization M21 of the first region A1 can be more easily subjected to a magnetization reversal. When a size of the second ferromagnetic metal layer 2 in the x direction is a size in which a magnetic wall can be formed, this phenomenon can be confirmed as magnetic wall movement. The same phenomenon occurs at a microscopic level and the same effect is obtained even when the size of the second ferromagnetic metal layer 2 in the x direction is smaller than the size in which the magnetic wall can be formed.

Figure 4:
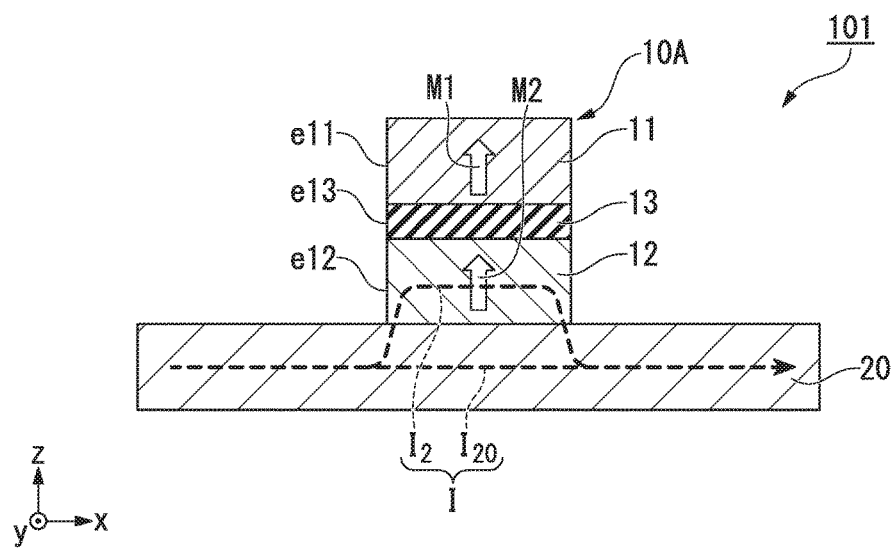
FIG. 4 is a schematic cross-sectional view of a spin current magnetoresistance effect element in which end portions of layers in a magnetoresistance effect element are present at the same position as viewed from the z direction.

FIG. 4 is a schematic cross-sectional view of a spin current magnetoresistance effect element in which end portions of layers in a magnetoresistance effect element are present at the same position as viewed from the z direction. A spin current magnetoresistance effect element 101 illustrated in FIG. 4 includes a magnetoresistance effect element 10A and a spin-orbit torque wiring 20. In the magnetoresistance effect element 10A, positions of a first end portion e11 in a first ferromagnetic metal layer 11, a second end portion e12 in a second ferromagnetic metal layer 12, and a third end portion e13 in a non-magnetic layer 13 in the x direction coincide with each other.

An axis of easy magnetization of the second ferromagnetic metal layer 12 in the spin current magnetoresistance effect element 101 illustrated in FIG. 4 is uniform in a plane. For this reason, it is not possible to provide STT to the magnetization M2 of the second ferromagnetic metal layer 12 even when the second current $I_2$ flows in the second ferromagnetic metal layer 12.

Figure 5:
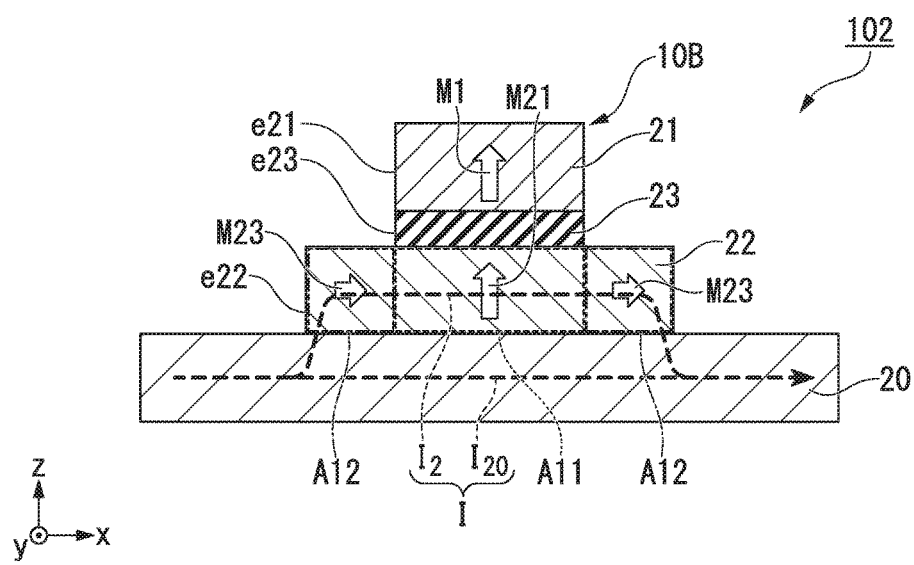
FIG. 5 is a schematic cross-sectional view of a spin current magnetoresistance effect element illustrated in PCT International Publication No. WO2016/021468.

Also, FIG. 5 is a schematic cross-sectional view of a spin current magnetoresistance effect element illustrated in PCT International Publication No. WO2016/021468. A spin current magnetoresistance effect element 102 illustrated in FIG. 5 includes a magnetoresistance effect element 10B and a spin-orbit torque wiring 20. In the magnetoresistance effect element 10B, a third end portion e23 in a non-magnetic layer 23 and a first end portion e21 in a first ferromagnetic metal layer 21 coincide with each other and a second end portion e22 in a second ferromagnetic metal layer 22 protrudes in the x direction.

Two regions are formed in the second ferromagnetic metal layer 22 in the magnetoresistance effect element 10B illustrated in FIG. 5. A first region A11 is a region facing the first ferromagnetic metal layer 21. The first region A11 corresponds to the first region A1 in FIG. 1. A second region A12 is a region in which the first ferromagnetic metal layer 21 does not overlap the non-magnetic layer 23 as viewed from the z direction. The second region A12 corresponds to the third region A3 in FIG. 1.

Also in the spin current magnetoresistance effect element 102 illustrated in FIG. 5, it is possible to provide STT and SOT to magnetization M21 of a second ferromagnetic metal layer 2 as in the spin current magnetoresistance effect element 100 illustrated in FIG. 1. However, the spin current magnetoresistance effect element 102 does not have a region corresponding to the second region A2 in FIG. 1. For this reason, it is not possible to propagate the influence of the magnetization M22 of the second region A2 and it is not possible to realize writing efficiency as high as that of the spin current magnetoresistance effect element 100 illustrated in FIG. 1.

As described above, according to the spin current magnetoresistance effect element 100 associated with the embodiment, the magnetization M2 of the second ferromagnetic metal layer 2 can be subjected to a magnetization reversal using SOT and STT. Furthermore, when three regions having different axes of easy magnetization are formed in the second ferromagnetic metal layer 2, the three regions can be sequentially subjected to a magnetization reversal from a portion which is easily subjected to the magnetization reversal. In other words, according to the spin current magnetoresistance effect element 100 associated with the embodiment, the magnetization M2 of the second ferromagnetic metal layer 2 can be more easily subjected to a magnetization reversal and it is possible to increase writing efficiency of data.

As described above, according to the spin current magnetoresistance effect element 100 associated with the embodiment, a magnetization reversal without a magnetic field can be performed. When three regions having different axes of easy magnetization are formed in the second ferromagnetic metal layer 2, the superior characteristics of magnetization reversals can be utilized. For example, when an angle formed by the orientation of the injected spins and the orientation of the axis of easy magnetization is parallel, a magnetization reversal without a magnetic field is possible. On the other hand, when the angle formed by the orientation of the injected spins and the orientation of the axis of easy magnetization is at a right angle, a high-speed magnetization reversal is possible due to an antidamping effect. In other words, when three regions having different axes of easy magnetization are formed in the second ferromagnetic metal layer 2, it is possible to perform a high-speed magnetization reversal without a magnetic field.

Also, in order to cause the magnetization M2 of the first region A1 in the second ferromagnetic metal layer 2 to be more easily subjected to a magnetization reversal, each constitution of the spin current magnetoresistance effect element 100 preferably has the following relationship.

It is desirable that a distance D1 (a width of the third region A3 in the x direction) between the third end portion e3 in the non-magnetic layer 3 and the second end portion e2 in the second ferromagnetic metal layer 2 be longer than a distance D2 (a width of the second region A2 in the x direction) between the first end portion e1 and the third end portion e3 in the first ferromagnetic metal layer 1. Furthermore, the distance D1 is preferably longer than a thickness T of the spin-orbit torque wiring and the distance D2 is preferably shorter than the thickness T of the spin-orbit torque wiring.

When the magnetization M22 of the second region A2 is subjected to a magnetization reversal, its influence propagates to the magnetization M21 of the first region A1. The propagation of its influence occurs without being limited to the total amount of the magnetization M22 of the second region A2. For this reason, it is desirable that the width of the second region A2 in the x direction is short. On the other hand, in the third region A3, it is necessary to sufficiently spin-polarize the second current $I_2$. For this reason, the third region A3 needs to have a certain length. When the distance D1 and the distance D2 satisfy the above-described relationship, a sufficiently spin-polarized second current $I_2$ can be caused to flow through the first region A1 and it is possible to transfer the influence of the magnetization M22 of the second region A2 to the magnetization M21 of the first region A1.

Also, the second region A2 is a region for alleviating a difference in magnetic anisotropy between the magnetization M21 of the first region A1 and the magnetization M23 of the third region A3. In other words, the second region A2 can also be regarded to exist as a magnetic wall. The width of the magnetic wall is generally said to be about 20 nm. On the other hand, it is possible to alleviate a difference in magnetic anisotropy even when the width of the second region A2 (the distance D2 between the first end portion e1 and the third end portion e3) is 20 nm or less. This is because the magnetic anisotropies of the first region A1, the second region A2, and the third region A3 are oriented to be strongly affected by the layers laminated in the z direction.

That is to say, the spin current magnetoresistance effect element 100 according to the embodiment can also be said to be an element in which the width of the magnetic wall (the width of the second region A2 or the distance D2 between the first end portion e1 and the third end portion e3) is short. The presence of the magnetic wall favorably affects a magnetization reversal but adversely affects an MR ratio. When the width of the magnetic wall is shortened, it is possible to realize the spin current magnetoresistance effect element 100 which is easily subjected to a magnetization reversal and has an excellent MR ratio.

Figure 6A:
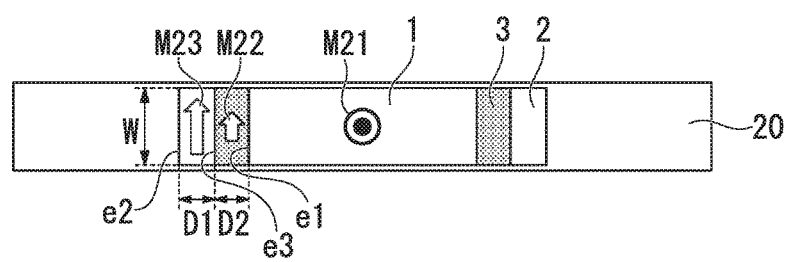
FIG. 6A is a diagram of the spin current magnetoresistance effect element according to the embodiment viewed in a plan view from the z direction.
Figure 6B:
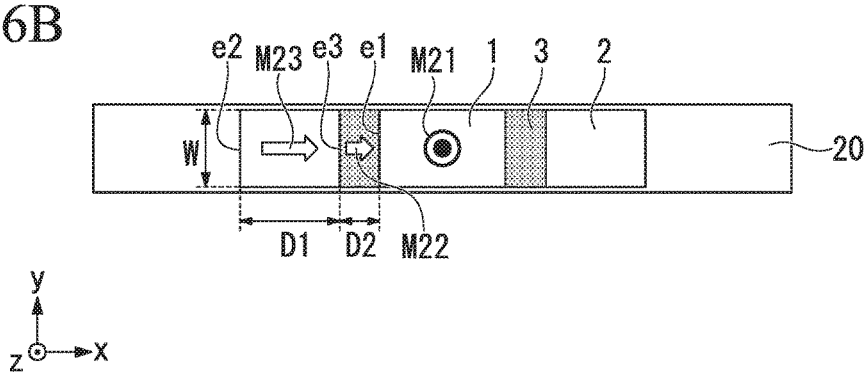
FIG. 6B is a diagram of the spin current magnetoresistance effect element according to the embodiment viewed in a plan view from the z direction.

FIGS. 6A and 6B are diagrams of the spin current magnetoresistance effect element 100 according to the embodiment viewed in a plan view from the z direction. FIG. 6A illustrates a case in which the distance D1 between the second end portion e2 and the third end portion e3 is shorter than the width W of the second ferromagnetic metal layer 2. FIG. 6B illustrates a case in which the distance D1 between the second end portion e2 and the third end portion e3 is longer than the width W of the second ferromagnetic metal layer 2.

As illustrated in FIG. 6A, when the distance D1 is shorter than the width W, the magnetization M23 of the third region A3 in the second ferromagnetic metal layer 2 is oriented in the y direction. The magnetization M22 of the second region A2 is in an intermediate state between the magnetization M21 of the first region A1 and the magnetization M23 of the third region A3 which are oriented in the z direction. In other words, the magnetization M22 of the second region A2 is oriented in the z direction while being inclined in the y direction.

As illustrated in FIG. 2, the spins injected from the spin-orbit torque wiring 20 are oriented in the y direction. The magnetization M22 of the second region A2 having a component in the y direction is easily affected by the spins and is strongly affected by the action of SOT. When the magnetization M22 is strongly affected by the action of SOT and is subjected to a magnetization reversal, the magnetization M21 of the first region A1 is also easily subjected to a magnetization reversal.

Also, when the distance D1 is shorter than the width W, it is desirable that the distance D2 between the first end portion e1 and the third end portion e3 be also shorter than the width W. If the distance D2 is shorter than the width W, the magnetization M22 of the second region A2 is also likely to be oriented in the y direction. When the orientation directions of the magnetization M23 of the third region A3 and the magnetization M22 of the second region A2 are aligned, the smooth propagation of the magnetization to the first region A1 is obtained.

On the other hand, as illustrated in FIG. 6B, when the distance D1 is longer than the width W, the magnetization M23 of the third region A3 in the second ferromagnetic metal layer 2 is oriented in the x direction. The magnetization M22 of the second region A2 is in an intermediate state between the magnetization M21 of the first region A1 and the magnetization M23 of the third region A3 which are oriented in the z direction. In other words, the magnetization M22 of the second region A2 is oriented in the z direction while being inclined in the x direction.

The magnetization M23 oriented in the x direction is hardly affected by the spins injected from the spin-orbit torque wiring 20 having a component in the y direction. For this reason, the magnetization M23 of the third region A3 is hardly affected by SOT. In other words, it is possible to strongly spin-polarize the second current $I_2$ flowing in the third region A3 in the x direction. As a result, it is possible to strongly apply the action of STT to the magnetization M21 of the first region A1 and the magnetization M22 of the second region A2.

Also, when the distance D1 is longer than the width W, it is desirable that the distance D2 between the first end portion e1 and the third end portion e3 be also longer than the width W. If the distance D2 is longer than the width W, the magnetization M22 of the second region A2 is also likely to be oriented in the x direction. When the orientation directions of the magnetization M23 of the third region A3 and the magnetization M22 of the second region A2 are aligned, the smooth propagation of the magnetization to the first region A1 is obtained.

Although the preferred embodiments of the present disclosure have been described in detail above, the present disclosure is not limited to such specific embodiments and various modifications and changes are possible within the scope of the present disclosure described in the claims.

In the spin current magnetoresistance effect element 100 illustrated in FIGS. 1 and 2, the first end portion e1, the second end portion e2, and the third end portion e3 satisfy a predetermined relationship on a lateral side of the magnetoresistance effect element 10 in the x direction. The relationship between these end portions is not limited to the lateral side thereof in the x direction and may be adopted as long as the relationship is satisfied on any lateral side of the magnetoresistance effect element.

Figure 7A:
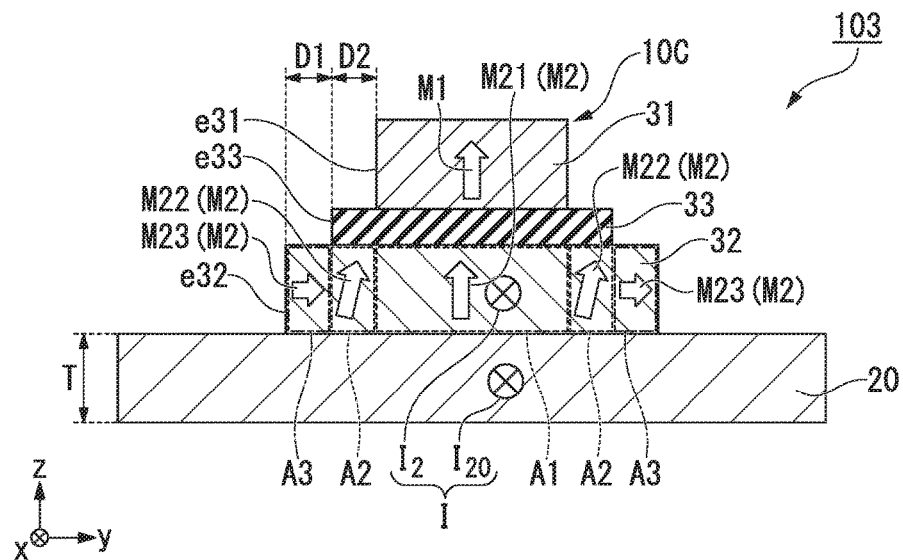
FIG. 7A is a cross-sectional views schematically illustrating another example of the spin current magnetoresistance effect element according to the embodiment.
Figure 7B:
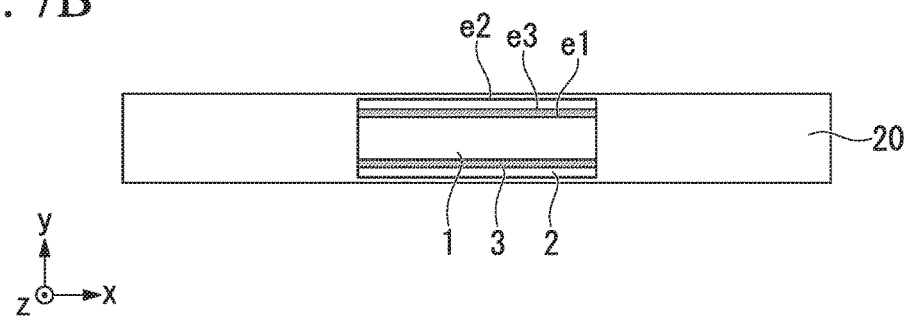
FIG. 7B is a cross-sectional views schematically illustrating another example of the spin current magnetoresistance effect element according to the embodiment.

For example, a spin current magnetoresistance effect element 103 illustrated in FIGS. 7A and 7B has a first end portion e31 in a first ferromagnetic metal layer 31, a second end portion e32 in a second ferromagnetic metal layer 32, and a third end portion e33 in a non-magnetic layer 33 which satisfy a predetermined relationship in the y direction. FIG. 7A is a cross-sectional view of the spin current magnetoresistance effect element 103 taken along a yz plane and FIG. 7B is a plan view of the spin current magnetoresistance effect element 103 viewed in a plan view from the z direction.

In the spin current magnetoresistance effect element 103 illustrated in FIGS. 7A and 7B, a current I flows in the x direction at the time of writing. The current I is divided into a first current $I_{20}$ and a second current $I_2$ as in the spin current magnetoresistance effect element 100 illustrated in FIG. 1. In the case of the spin current magnetoresistance effect element 103 illustrated in FIGS. 7A and 7B, a current component from the third region A3 toward the first region A1 is small. Thus, it is not possible to cause STT to greatly act on the magnetization M21 of the first region A1. However, since a current component flowing in the y direction is not zero, STT acts on the magnetization M21 of the first region A1.

Also, in the spin current magnetoresistance effect element 103 in FIGS. 7A and 7B, the magnetization M22 of the second region A2 in the second ferromagnetic metal layer 32 tilts in the y direction. The spins injected from the spin-orbit torque wiring 20 are oriented in the y direction. The magnetization M22 of the second region A2 having a component in the y direction is easily affected by the spins and is strongly affected by the action of SOT. Therefore, also in the spin current magnetoresistance effect element 103 illustrated in FIGS. 7A and 7B, the STT and the SOT can act at the same time and the magnetization M2 of the second ferromagnetic metal layer 2 can be easily subjected to a magnetization reversal.

Figure 8:
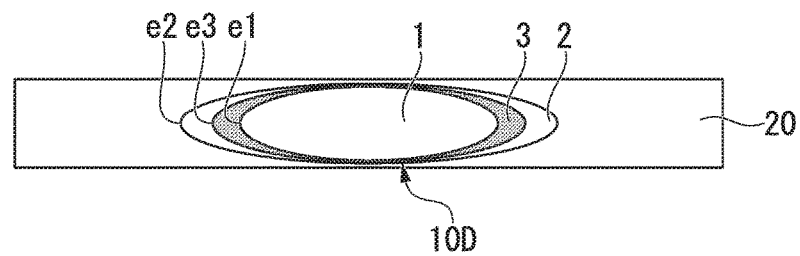
FIG. 8 is a diagram of another example of the spin current magnetoresistance effect element according to the embodiment viewed in a plan view from the z direction.

Also, in the spin current magnetoresistance effect element 100 illustrated in FIGS. 1 and 2, a planar shape of the magnetoresistance effect element 10 viewed from the z direction is rectangular, but the planar shape of the magnetoresistance effect element 10 is not particularly limited. For example, as in a magnetoresistance effect element 10D illustrated in FIG. 8, an elliptical shape or a circular shape may be adopted. When a planar shape of the magnetoresistance effect element 10D is elliptical or circular, the expression "on either lateral side of a magnetoresistance effect element" can be paraphrased as the expression "in any direction on a lateral side of a magnetoresistance effect element."

Figure 9:
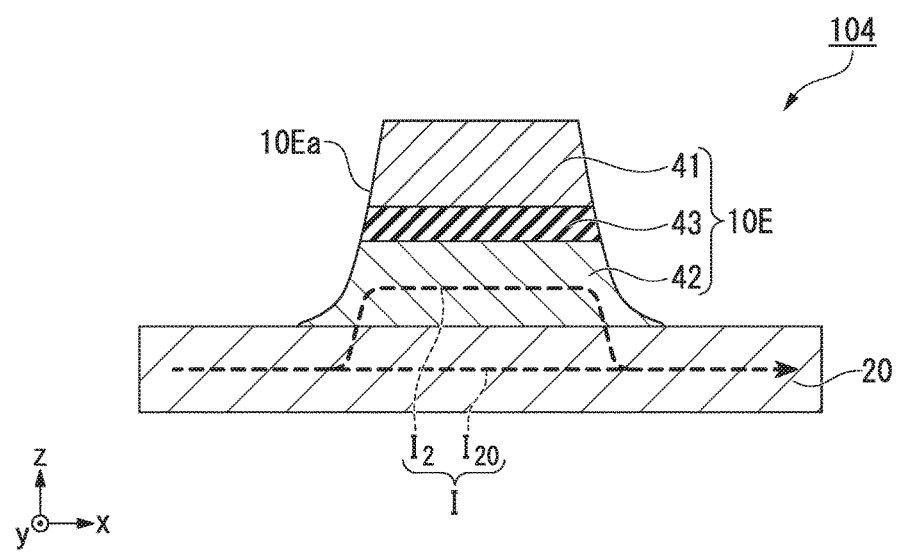
FIG. 9 is a cross-sectional view schematically illustrating yet another example of the spin current magnetoresistance effect element according to the embodiment.

Also, as in a spin current magnetoresistance effect element 104 illustrated in FIG. 9, a lateral side in a magnetoresistance effect element 10E may be an inclined surface 10Ea formed to extend from a first ferromagnetic metal layer 41 toward a second ferromagnetic metal layer 42 in the z direction. As illustrated in FIG. 9, when the lateral side is the inclined surface 10Ea, the second current $I_2$ can flow along the inclined surface 10Ea. When a flow of the second current $I_2$ is controlled, the STT can be effectively applied to the magnetization of the second ferromagnetic metal layer 42.

Figure 10:
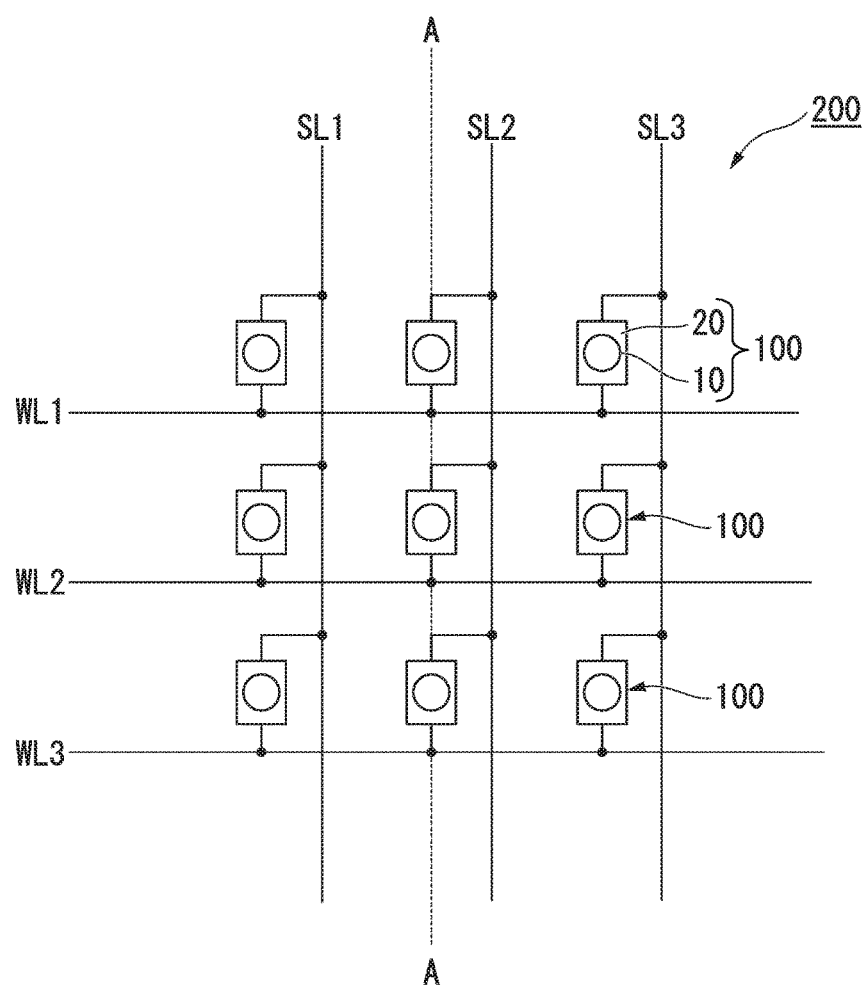
FIG. 10 is a cross-sectional view schematically illustrating an example of a magnetic memory according to an embodiment.

Also, a plurality of spin current magnetoresistance effect elements as described above may be arranged to form a magnetic memory (FIG. 10). In the magnetic memory illustrated in FIG. 10, a plurality of spin current magnetoresistance effect elements 100 are connected using a source line SL and a word line WL. Each of the spin current magnetoresistance effect elements constituting the magnetic memory stores data. Since the writing efficiency of each of the spin current magnetoresistance effect elements is enhanced, the magnetic memory also has the excellent writing efficiency.

EXPLANATION OF REFERENCES 1, 11, 21, 31, 41 First ferromagnetic metal layer
2, 12, 22, 32, 42 Second ferromagnetic metal layer
3, 13, 23, 33, 43 Non-magnetic layer
10, 10A, 10B, 10C, 10D, 10E Magnetoresistance effect element
20 Spin-orbit torque wiring
e1 First end portion
e2 Second end portion
e3 Third end portion
A1 First region
A2 Second region
A3 Third region
100, 101, 102, 103, 104 Spin current magnetoresistance effect element

What is claimed is:

1. A spin current magnetoresistance effect element, comprising:
   a magnetoresistance effect element including a first ferromagnetic metal layer, a second ferromagnetic metal layer configured for magnetization direction to be changed, and a non-magnetic layer sandwiched between the first ferromagnetic metal layer and the second ferromagnetic metal layer; and
   a spin-orbit torque wiring extending in a first direction which intersects a lamination direction of the magnetoresistance effect element and joined to the second ferromagnetic metal layer,
   wherein, a third end portion of the non-magnetic layer is located between a first end portion of the first ferromagnetic metal layer and a second end portion of the second ferromagnetic metal layer as viewed from the lamination direction on one of side surfaces of the magnetoresistance effect element.

2. The spin current magnetoresistance effect element according to claim 1, wherein a distance between the second end portion and the third end portion is longer than a distance between the first end portion and the third end portion.

3. The spin current magnetoresistance effect element according to claim 1, wherein the one of side surfaces on which the first end portion, the second end portion, and the third end portion are present is located in the first direction of the magnetoresistance effect element.

4. The spin current magnetoresistance effect element according to claim 2, wherein the one of side surfaces on which the first end portion, the second end portion, and the third end portion are present is located in the first direction of the magnetoresistance effect element.

5. The spin current magnetoresistance effect element according to claim 1, wherein a distance between the second end portion and the third end portion is longer than a thickness of the spin-orbit torque wiring.

6. The spin current magnetoresistance effect element according to claim 2, wherein a distance between the second end portion and the third end portion is longer than a thickness of the spin-orbit torque wiring.

7. The spin current magnetoresistance effect element according to claim 3, wherein a distance between the second end portion and the third end portion is longer than a thickness of the spin-orbit torque wiring.

8. The spin current magnetoresistance effect element according to claim 4, wherein a distance between the second end portion and the third end portion is longer than a thickness of the spin-orbit torque wiring.

9. The spin current magnetoresistance effect element according to claim 1, wherein a distance between the first end portion and the third end portion is shorter than a thickness of the spin-orbit torque wiring.

10. The spin current magnetoresistance effect element according to claim 2, wherein a distance between the first end portion and the third end portion is shorter than a thickness of the spin-orbit torque wiring.

11. The spin current magnetoresistance effect element according to claim 3, wherein a distance between the first end portion and the third end portion is shorter than a thickness of the spin-orbit torque wiring.

12. The spin current magnetoresistance effect element according to claim 4, wherein a distance between the first end portion and the third end portion is shorter than a thickness of the spin-orbit torque wiring.

13. The spin current magnetoresistance effect element according to claim 5, wherein a distance between the first end portion and the third end portion is shorter than a thickness of the spin-orbit torque wiring.

14. The spin current magnetoresistance effect element according to claim 6, wherein a distance between the first end portion and the third end portion is shorter than a thickness of the spin-orbit torque wiring.

15. The spin current magnetoresistance effect element according to claim 1, wherein a distance between the second end portion and the third end portion is shorter than a width of the second ferromagnetic metal layer in a direction perpendicular to the first direction and the lamination direction.

16. The spin current magnetoresistance effect element according to claim 15, wherein a distance between the first end portion and the third end portion is shorter than the width of the second ferromagnetic metal layer in the direction perpendicular to the first direction and the lamination direction.

17. The spin current magnetoresistance effect element according to claim 1, wherein a distance between the second end portion and the third end portion is longer than a width of the second ferromagnetic metal layer in a direction perpendicular to the first direction and the lamination direction.

18. The spin current magnetoresistance effect element according to claim 17, wherein a distance between the first end portion and the third end portion is longer than the width of the second ferromagnetic metal layer in the direction perpendicular to the first direction and the lamination direction.

19. The spin current magnetoresistance effect element according to claim 1, wherein the one of side surfaces of the magnetoresistance effect element is an inclined surface extending from the first ferromagnetic metal layer toward the second ferromagnetic metal layer in the lamination direction.

20. A magnetic memory, comprising:
the plurality of spin current magnetoresistance effect elements according to claim 1.

* * * * *